(12) United States Patent
Awaji et al.

(10) Patent No.: US 7,459,897 B2
(45) Date of Patent: Dec. 2, 2008

(54) TERMINATOR CIRCUIT, TEST APPARATUS, TEST HEAD, AND COMMUNICATION DEVICE

(75) Inventors: Toshiaki Awaji, Tokyo (JP); Takashi Sekino, Tokyo (JP)

(73) Assignee: Advantest Corporation, Tokyo (JP)

( * ) Notice: Subject to any disclaimer, the term of this patent is extended or adjusted under 35 U.S.C. 154(b) by 1 day.

(21) Appl. No.: 11/706,572

(22) Filed: Feb. 14, 2007

(65) Prior Publication Data

US 2007/0257658 A1    Nov. 8, 2007

Related U.S. Application Data

(63) Continuation of application No. PCT/JP2005/014542, filed on Aug. 8, 2005.

(30) Foreign Application Priority Data

Aug. 16, 2004  (JP)  ............................ 2004-236432

(51) Int. Cl.
*G01R 19/00* (2006.01)
*G01R 27/08* (2006.01)

(52) U.S. Cl. .................... 324/76.11; 324/713
(58) Field of Classification Search .............. 324/76.11, 324/158.1, 73.1, 765, 522, 713, 98
See application file for complete search history.

(56) References Cited

U.S. PATENT DOCUMENTS

| | | | |
|---|---|---|---|
| 5,223,798 A * | 6/1993 | McGinnis et al. | 324/713 |
| 5,339,025 A * | 8/1994 | Jones et al. | 324/71.6 |
| 5,736,851 A * | 4/1998 | Noda | 324/158.1 |
| 5,945,823 A * | 8/1999 | Noda | 324/158.1 |
| 6,066,946 A * | 5/2000 | Noda | 324/158.1 |
| 6,191,573 B1 * | 2/2001 | Noda | 324/158.1 |
| 6,747,470 B2 * | 6/2004 | Muhtaroglu et al. | 324/765 |
| 2001/0048300 A1 * | 12/2001 | Noda | 324/158.1 |
| 2002/0043971 A1 * | 4/2002 | Noda | 324/158.1 |

FOREIGN PATENT DOCUMENTS

| | | |
|---|---|---|
| JP | 4-34382 | 2/1992 |
| JP | 8-285926 | 11/1996 |
| JP | 2001-4692 | 1/2001 |

OTHER PUBLICATIONS

International Search Report issued in International Application No. PCT/JP/2005/014542 mailed on Nov. 8, 2005 and English translation thereof, 3 pages.

* cited by examiner

*Primary Examiner*—Diego Gutierrez
*Assistant Examiner*—Hoai-An D Nguyen
(74) *Attorney, Agent, or Firm*—Osha•Liang LLP

(57) ABSTRACT

The present invention provides a terminator circuit including a potential variation detecting section that detects a variation in a potential at an end point to which an input signal is supplied, and a first current generating section that reduces an overshoot at the end point which is caused by the application of the input signal, by pulling a current from the end point, when the potential variation detecting section detects a rise in the potential at the end point. Here, the potential variation detecting section includes a comparison potential generating section that generates a comparison potential based on a reference potential, and a potential comparing section that compares the comparison potential which has risen in accordance with the rise in the potential at the end point, with the reference potential, and outputs a result of the comparison.

16 Claims, 3 Drawing Sheets

Prior Art

US 7,459,897 B2

TERMINATOR CIRCUIT, TEST APPARATUS, TEST HEAD, AND COMMUNICATION DEVICE

CROSS REFERENCE TO RELATED APPLICATION

This is a continuation application of PCT/JP2005/014542 filed on Aug. 8, 2005 which claims priority from a Japanese Patent Application No. 2004-236432 filed on Aug. 16, 2004, the contents of which are incorporated herein by reference.

BACKGROUND

1. Technical Field

The present invention relates to a terminator circuit, a test apparatus, a test head and a communication device. More particularly, the present invention relates to a terminator circuit which reduces the overshoot at the end point, and a test apparatus, a test head and a communication device including the terminator circuit.

2. Related Art

FIG. 1 shows the configuration of a conventional terminator circuit 10. The terminator circuit 10 includes therein an amplifier 18, a resistance 22, and a capacitor 24. The terminator circuit 10 has a function of reducing the overshoot of the input signal input into comparators 14 and 16 provided in a test head of a test apparatus by a device under test (hereinafter referred to as DUT) 12. Here, the input potential $V_{CPIN}$ input into the comparators 14 and 16 is theoretically equal to $(((V_{DUT}-V_{tt})/(R_{DUT}+R_{term}))\times R_{term})+V_{tt}$.

According to the terminator circuit 10 shown in FIG. 1, the output resistance $R_{vtt}$ of the amplifier 18 is finite. Therefore, if the amplifier 18 has an operating frequency range including a high frequency, and has a high gain, the influence of the output resistance $R_{vtt}$ can be ignored. However, if the amplifier 18 is constituted by using a typical operational amplifier, the operating frequency of the amplifier 18 is lower than the frequency of the input signal from the DUT 12, and the output resistance $R_{vtt}$ affects the input potential $V_{CPIN}$ input into the comparators 14 and 16. As a typical solution for this problem, the capacitor 24, which has a high capacitance $C_{vtt}$, is additionally provided between the ground potential and a point between the input ends of the comparators 14 and 16 and the output end of the amplifier 18. However, if the input signal from the DUT 12 includes a high frequency component, the conventional terminator circuit 10 can not track the input signal to sufficiently reduce the overshoot of the input signal.

SUMMARY

In view of the foregoing problem, an advantage of some embodiments of the present invention is to provide a terminator circuit, a test apparatus, a test head and a communication device which can solve the above-mentioned problem. This object is achieved by combining the features recited in the independent claims. The dependent claims define further effective specific example of the present invention.

A first embodiment of the present invention provides a terminator circuit including a potential variation detecting section that detects a variation in a potential at an end point to which an input signal is supplied, and a first current generating section that reduces an overshoot at the end point which is caused by the application of the input signal, by pulling a current from the end point, when the potential variation detecting section detects a rise in the potential at the endpoint.

Here, the first current generating section pulls the current from the end point by increasing current leakage to a ground point.

The potential variation detecting section may include a comparison potential generating section that generates a comparison potential based on a reference potential, and a potential comparing section that compares the comparison potential which has risen in accordance with the rise in the potential at the end point, with the reference potential, and outputs a result of the comparison, and the first current generating section may pull the current from the end point, based on the result of the comparison output from the potential comparing section.

The terminator circuit may further include a second current generating section that adjusts the comparison potential to be equal to the reference potential by pulling a current from an output end of the comparison potential generating section based on the result of the comparison output from the potential comparing section, when the comparison result indicates that the comparison potential is higher than the reference potential.

The comparison potential generating section may operate in such a manner that the reference potential is input into a noninverting input terminal thereof, the comparison potential which is an output potential from the comparison potential generating section is input into an inverting input terminal thereof, and the comparison potential is adjusted to be equal to the reference potential.

The potential comparing section may be input with the reference potential at an inverting input terminal thereof, and input with the comparison potential which has risen in accordance with the rise in the potential at the end point at a noninverting input terminal thereof, and the second current generating section may reduce the comparison potential by pulling the current from the output end of the comparison potential generating section which adjusts the comparison potential to be equal to the reference potential, to adjust the comparison potential to be equal to the reference potential. The potential comparing section may operate at a higher speed than the comparison potential generating section. The comparison potential generating section may be an amplifier that outputs a voltage, and the potential comparing section may be an amplifier that outputs a current.

A second embodiment of the present invention provides a test apparatus for testing a device under test. The test apparatus includes a comparator that compares an input signal input by the device under test with a predetermined threshold voltage, and a terminator circuit that reduces an overshoot of a potential at an input end of the comparator. Here, the terminator circuit includes a potential variation detecting section that detects a variation in the potential at the input end of the comparator to which the input signal is supplied, and a first current generating section that reduces the overshoot at the input end of the comparator which is caused by the application of the input signal, by pulling a current from the input end of the comparator, when the potential variation detecting section detects a rise in the potential at the input end of the comparator.

A third embodiment of the present invention provides a test head for supplying an input signal input by a device under test to a comparator that compares the input signal with a predetermined threshold voltage. The test head includes a potential variation detecting section that detects a variation in a potential at an input end of the comparator to which the input signal is supplied, and a first current generating section that reduces an overshoot at the input end of the comparator which is caused by the application of the input signal, by pulling a current from the input end of the comparator, when the potential variation detecting section detects a rise in the potential at the input end of the comparator.

A fourth embodiment of the present invention provides a communication device including a potential variation detecting section that detects a variation in a potential at an end point to which an input signal is supplied, and a first current generating section that reduces an overshoot at the end point which is caused by the application of the input signal, by pulling a current from the endpoint, when the potential variation detecting section detects a rise in the potential at the end point.

Here, all the necessary features of the present invention are not listed in the summary. The sub-combinations of the features may become the invention.

DESCRIPTION OF EXEMPLARY EMBODIMENTS

Hereinafter, one aspect of the present invention will be described through some embodiments of the present invention. The embodiment does not limit the invention according to the claims, and all the combinations of the features described in the embodiment are not necessarily essential to means provided by aspects of the invention.

Figure 1:
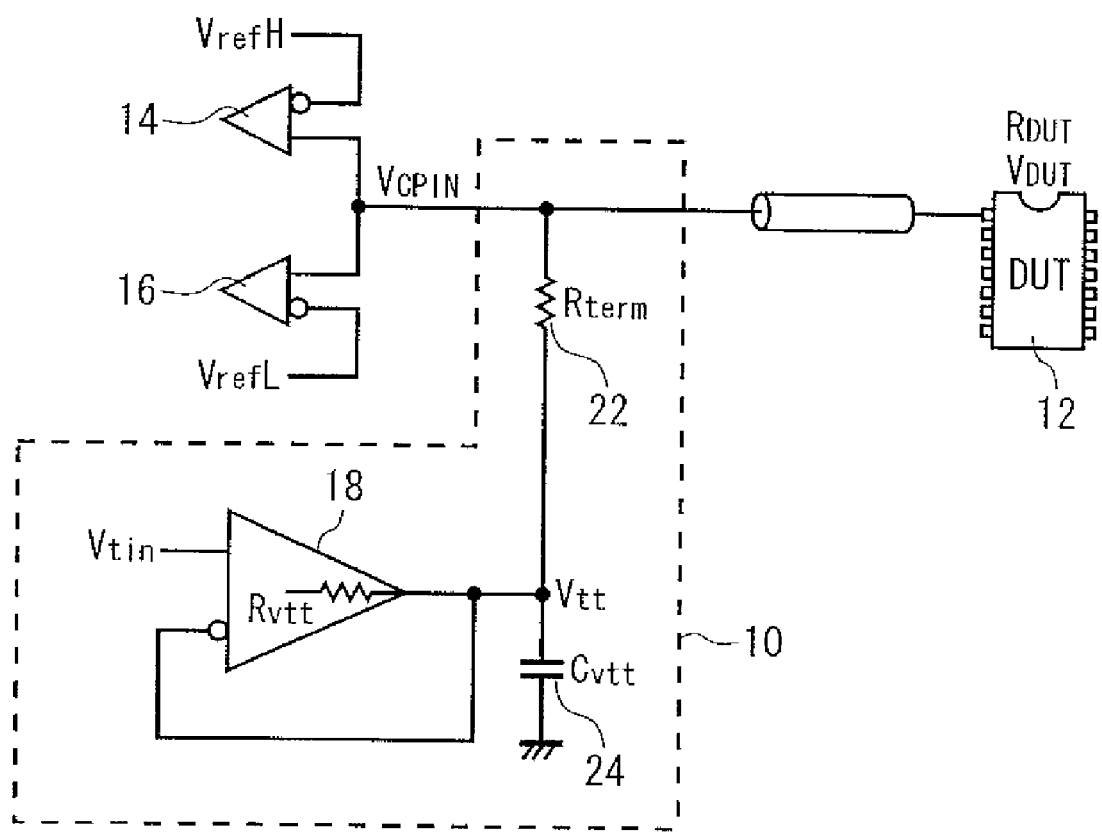
FIG. 1 shows the configuration of a conventional terminator circuit 10.
Figure 2:
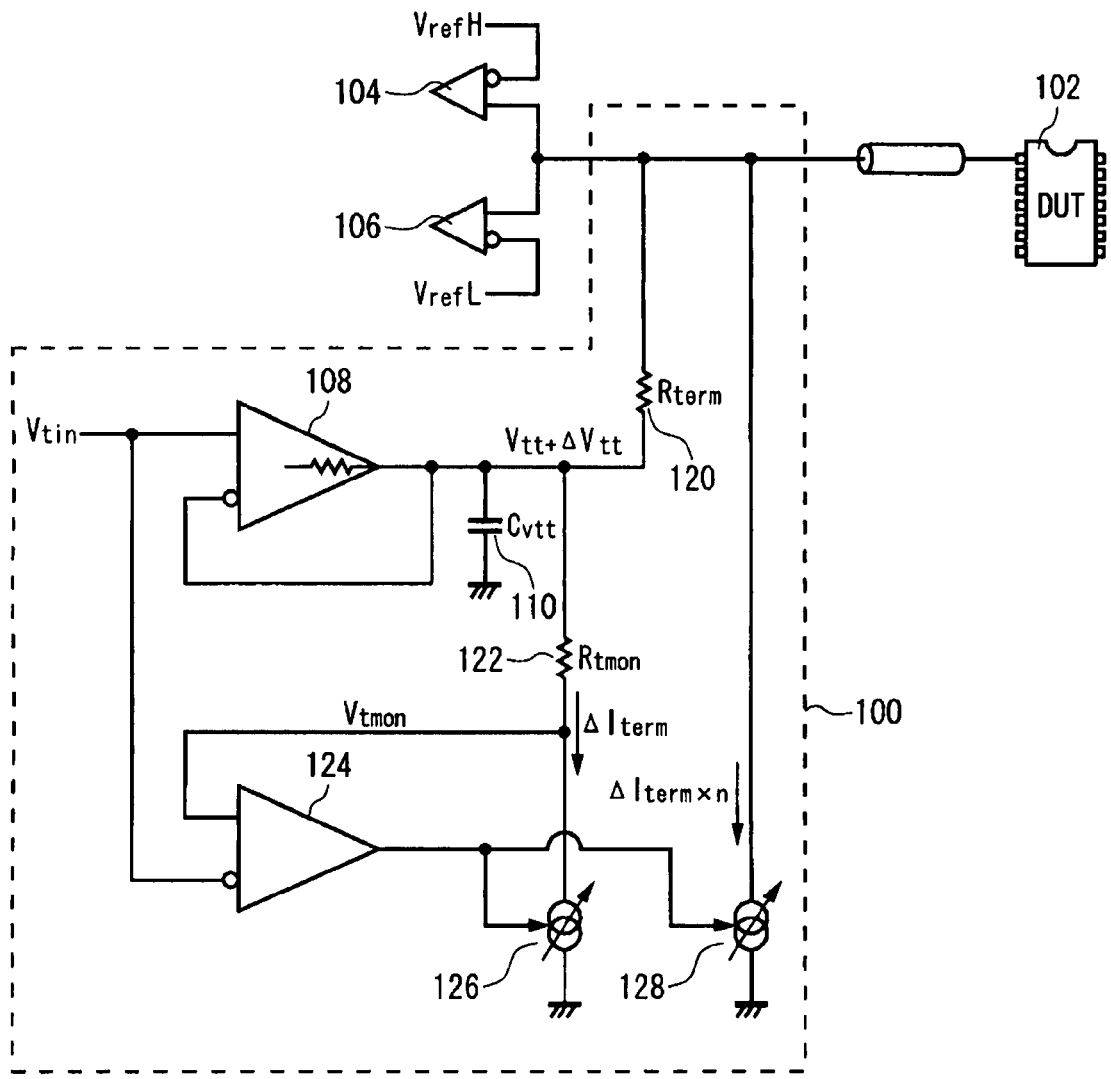
FIG. 2 shows, as one example, the configuration of a terminator circuit 100 relating to an embodiment of the present invention.
Figure 3:
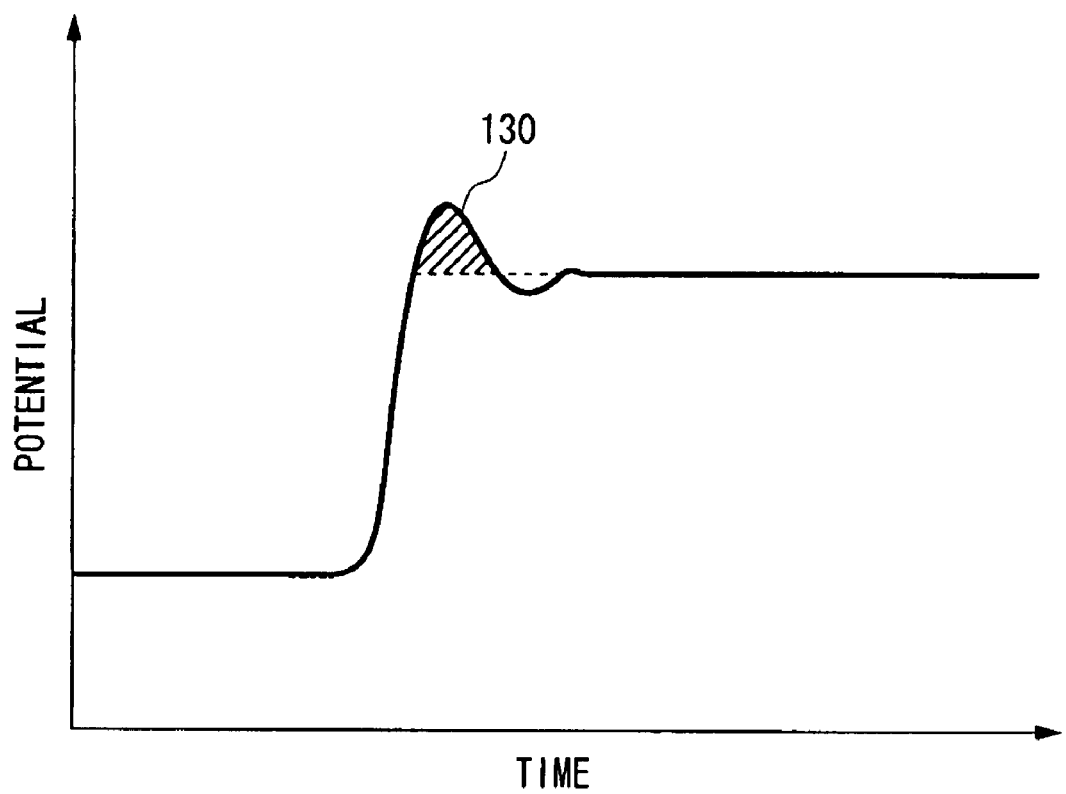
FIG. 3 shows, as one example, the variation in the potential at the end point of the terminator circuit 100.

FIG. 2 shows, as one example, the configuration of a terminator circuit 100 relating to an embodiment of the present invention. FIG. 3 shows, as one example, the transition of the potential at the end point of the terminator circuit 100 relating to the present embodiment. The present embodiment is directed to the terminator circuit 100 provided in a test apparatus to test a DUT 102. The terminator circuit 100 is disposed in a test head that supplies, to comparators 104 and 106 provided in a test module, an input signal input by the DUT 102. The terminator circuit 100 reduces the overshoot of the potential at the input ends of the comparators 104 and 106.

The comparators 104 and 106 each compare the input signal input by the DUT 102 with a predetermined threshold voltage, and output the result of the comparison. The outputs of the comparators 104 and 106 are compared to an expected value by an expected value comparing section provided in the test module, and the acceptability of the DUT 102 is judged based on the result of the comparison done by the expected value comparing section.

In other embodiments, the terminator circuit 100 may be used as a terminator circuit for a bus circuit of a communication device, such as a system bus for relaying the communications between a CPU and a peripheral circuit. Alternatively, the terminator circuit 100 may be used as a terminator circuit for a communication device such as a wireless long-distance communication device.

The terminator circuit 100 includes therein an amplifier 108, a capacitor 110, a resistance 120, a resistance 122, an amplifier 124, a current source 126, and a current source 128. The amplifier 108 is shown as one example of a comparison potential generating section relating to the present invention, the amplifier 124 is shown as one example of a potential comparing section relating to the present invention, the current source 126 is shown as one example of a second current generating section relating to the present invention, and the current source 128 is shown as one example of a first current generating section relating to the present invention. The other constituents of the terminator circuit 100 than the current source 128, that is to say, the amplifier 108, capacitor 110, resistances 120 and 122, amplifier 124, and current source 126 are collectively shown as one example of a potential variation detecting section relating to the present invention.

The amplifier 108 generates a comparison potential $V_{tt}$ based on a reference potential $V_{tin}$. Specifically speaking, the amplifier 108 operates in such a manner that the reference potential $V_{tin}$ is input into the noninverting input terminal, the comparison potential $V_{tt}$, which is the output potential from the amplifier 108, is input into the inverting input terminal, and the comparison potential $V_{tt}$ is adjusted so as to be equal to the reference potential $V_{tin}$. The output end of the amplifier 108 is electrically connected to the end point via the resistance 120, and the amplifier 108 has a function of reducing the overshoot of the end point. However, since the operating frequency of the amplifier 108 is lower than the frequency of the input signal input into the end point, the amplifier 108 alone is not capable of sufficiently reducing the overshoot of the end point. Therefore, if the potential of the end point suddenly increases, the output potential of the amplifier 108, i.e. the comparison potential, accordingly increases from $V_{tt}$ to $V_{tt}+\Delta V_{tt}$.

The capacitor 110 is provided between the grounded point and a point between the output end of the amplifier 108 and the resistance. The capacitor 110 has a function of reducing the overshoot at the end point, together with the amplifier 108. Nevertheless, if the potential at the end point suddenly increases, the capacitor 110 can not sufficiently reduce the overshoot of the end point even by operating together with the amplifier 108. Which is to say, the amplifier 108 and capacitor 110 together have a function of reducing the variation in potential at the end point, which is caused by the low-frequency component included in the input signal input by the DUT 102.

The amplifier 124 detects, via the resistances 120 and 122, the variation in potential at the input ends (hereinafter referred to as "end point") of the comparators 104 and 106 to which the input signal is applied by the DUT 102. Specifically speaking, the amplifier 124 operates in such a manner that the reference potential $V_{tin}$ is input into the inverting input terminal, the comparison potential that has increased in accordance with the increase in the potential at the end point ($V_{tt}+\Delta V_{tt}$) is input into the noninverting input terminal via the resistance 122, a potential $V_{tmon}$ equal to the comparison potential $V_{tt}+\Delta V_{tt}$ which has dropped due to the resistance 122 is compared with the reference potential $V_{tin}$, and the result of the comparison is output to be supplied to the current sources 126 and 128. The amplifier 124 operates at a higher speed than the amplifier 108. For example, while the amplifier 108 outputs a voltage, the amplifier 124 outputs a current. Having the above-described configuration, the amplifier 124 has a function of reducing the variation in potential at the end point which is caused by the high-frequency component included in the input signal input by the DUT 102.

The current source 126 reduces the comparison potential $V_{tt}+\Delta V_{tt}$ by pulling a current from the output end of the amplifier 108 based on the result of the comparison output from the amplifier 124, to match the comparison potential to the reference potential, when the comparison result indicates that the comparison potential $V_{tt}+\Delta V_{tt}$ is higher than the reference potential $V_{tin}$. The current source 126 pulls the current from the output end of the amplifier 108 by increasing the current leakage to the ground point. Here, the current source 126 is a constant current source for generating a constant current $\Delta I_{term}$.

The current source 128 reduces the overshoot of the end point which is caused by the application of the input signal, by pulling a current from the end point based on the result of the comparison output from the amplifier 124, when the comparison result indicates a rise in potential at the end point. Here, the current source 128 pulls the current from the end point by increasing the current leakage to the ground point. Which is to say, the current source 128 can control the potential of the overshoot 130 shown in FIG. 3. Here, the current source 128 is a constant current source for generating a constant current $\Delta I_{term} \times n$.

Here, the following equation is true.

$$V_{tom} = V_{tt} + \Delta V_{tt} - R_{tmon} \times \Delta I_{term} = V_{tin}$$

With respect to the input ends of the comparators 104 and 106, the voltage of the terminator circuit 100 can be represented by the following expression.

$$V_{tt} + \Delta V_{tt} - R_{term} \times \Delta I_{term} \times n$$

To maintain the potential at the end point at a constant level, that is to say, to make the following equation true, $$V_{tt} + \Delta V_{tt} - R_{term} \times \Delta I_{term} \times n = V_{tt}$$

the value of n is adjusted to satisfy the following equation.

$$\Delta V_{tt} = R_{term} \times \Delta I_{term} \times n$$

As described above, the variation in the potential at the end point can be reduced. In addition, since the resistance of the terminator circuit 100 is adjusted by varying the value of $R_{term}$, the resistance of the terminator circuit 100 can be maintained with high accuracy.

Here, the following equation is normally true.

$$n = R_{tom}/R_{term}$$

As discussed above, the terminator circuit 100 relating to the present embodiment is configured by adding the amplifier 124 which detects the variation in potential at the end point at a high speed, and the current source 128 which pulls a current from the end point, to the conventional terminator circuit 10. Therefore, the terminator circuit 100 relating to the present embodiment can track at a high speed the input signal the frequency components of which include a high frequency to reduce the variation in potential. As a result, the terminator circuit 100 can sufficiently reduce the potential of the overshoot 130 at the end point which is shown in FIG. 3, and therefore can accurately supply the input signal from the DUT 102 to the comparators 104 and 106.

While one aspect of the present invention has been described through embodiments, the technical scope of the invention is not limited to the above described embodiment. It is apparent to persons skilled in the art that various alternations and improvements can be added to the above-described embodiment. It is also apparent from the scope of the claims that the embodiments added with such alternations or improvements can be included in the technical scope of the invention.

As clearly indicated by the foregoing description, a terminator circuit relating to an embodiment of the present invention can sufficiently reduce the overshoot at the end point.

What is claimed is:

1. A terminator circuit comprising:
    a potential variation detecting section that detects a variation in a potential at an end point to which an input signal is supplied; and
    a first current generating section that reduces an overshoot at the end point which is caused by the application of the input signal, by pulling a current from the end point, when the potential variation detecting section detects a rise in the potential at the end point, wherein
    the first current generating section pulls the current from the end point by increasing current leakage to a ground point,
    the first current generating section is provided between the end point and the ground point, and
    the first current generating section is provided parallel to a second current generating section.

2. The terminator circuit as set forth in claim 1, wherein the potential variation detecting section includes:
    a comparison potential generating section that generates a comparison potential based on a reference potential; and
    a potential comparing section that compares the comparison potential which has risen in accordance with the rise in the potential at the end point, with the reference potential, and outputs a result of the comparison, and
    the first current generating section pulls the current from the end point, based on the result of the comparison output from the potential comparing section.

3. The terminator circuit as set forth in claim 2, wherein the second current generating section adjusts the comparison potential to be equal to the reference potential by pulling a current from an output end of the comparison potential generating section based on the result of the comparison output from the potential comparing section, when the comparison result indicates that the comparison potential is higher than the reference potential.

4. The terminator circuit as set forth in claim 3, wherein
    the potential comparing section is input with the reference potential at an inverting input terminal thereof, and input with the comparison potential which has risen in accordance with the rise in the potential at the end point at a noninverting input terminal thereof, and
    the second current generating section reduces the comparison potential by pulling the current from the output end of the comparison potential generating section which adjust the comparison potential to be equal to the reference potential.

5. The terminator circuit as set forth in claim 3, wherein the comparison potential generating section operates in such a manner that the reference potential is input into a noninverting input terminal thereof, the comparison potential which is an output potential from the comparison potential generating section is input into an inverting input terminal thereof, and the comparison potential is adjusted to be equal to the reference potential.

6. The terminator circuit as set forth in claim 2, wherein the comparison potential generating section is an amplifier that outputs a voltage, and the potential comparing section is an amplifier that outputs a current.

7. The terminator circuit as set forth in claim 2, wherein the potential comparing section operates at a higher speed than the comparison potential generating section.

8. A test apparatus for testing a device under test, the test apparatus comprising:
    a comparator that compares an input signal input by the device under test with a predetermined threshold voltage; and a terminator circuit that reduces an overshoot of a potential at an input end of the comparator, wherein
the terminator circuit includes:
a potential variation detecting section that detects a variation in the potential at the input end of the comparator to which the input signal is supplied; and
a first current generating section that reduces the overshoot at the input end of the comparator which is caused by the application of the input signal, by pulling a current from the input end of the comparator, when the potential variation detecting section detects a rise in the potential at the input end of the comparator, wherein
the first current generating section pulls the current from the input end by increasing current leakage to a ground point,
the first current generating section is provided between the input end and the ground point, and
the first current generating section is provided parallel to a second current generating section.

9. The test apparatus as set forth in claim 8, wherein the potential variation detecting section includes:
a comparison potential generating section that generates a comparison potential based on a reference potential; and
a potential comparing section that compares the comparison potential which has risen in accordance with the rise in the potential at the end point, with the reference potential, and outputs a result of the comparison, and
the first current generating section pulls the current from the end point, based on the result of the comparison output from the potential comparing section.

10. The test apparatus as set forth in claim 9, wherein the second current generating section adjusts the comparison potential to be equal to the reference potential by pulling a current from an output end of the comparison potential generating section based on the result of the comparison output from the potential comparing section, when the comparison result indicates that the comparison potential is higher than the reference potential.

11. A test head for supplying an input signal input by a device under test to a comparator that compares the input signal with a predetermined threshold voltage, the test head comprising:
a potential variation detecting section that detects a variation in a potential at an input end of the comparator to which the input signal is supplied; and
a first current generating section that reduces an overshoot at the input end of the comparator which is caused by the application of the input signal, by pulling a current from the input end of the comparator, when the potential variation detecting section detects a rise in the potential at the input end of the comparator, wherein
the first current generating section pulls the current from the input end of the comparator by increasing current leakage to a ground point,
the first current generating section is provided between the end point and the ground point, and
the first current generating section is provided parallel to a second current generating section.

12. The test head as set forth in claim 11, wherein the potential variation detecting section includes:
a comparison potential generating section that generates a comparison potential based on a reference potential; and
a potential comparing section that compares the comparison potential which has risen in accordance with the rise in the potential at the input end of the comparator, with the reference potential, and outputs a result of the comparison, and
the first current generating section pulls the current from the input end of the comparator, based on the result of the comparison output from the potential comparing section.

13. The test head as set forth in claim 12, wherein the second current generating section adjusts the comparison potential to be equal to the reference potential by pulling a current from an output end of the comparison potential generating section based on the result of the comparison output from the potential comparing section, when the comparison result indicates that the comparison potential is higher than the reference potential.

14. A communication device comprising:
a potential variation detecting section that detects a variation in a potential at an end point to which an input signal is supplied; and
a first current generating section that reduces an overshoot at the end point which is caused by the application of the input signal, by pulling a current from the end point, when the potential variation detecting section detects a rise in the potential at the end point, wherein
the first current generating section pulls the current from the end point by increasing current leakage to a ground point,
the first current generating section is provided between the end point and the ground point, and
the first current generating section is provided parallel to a second current generating section.

15. The communication device as set forth in claim 14, wherein
the potential variation detecting section includes:
a comparison potential generating section that generates a comparison potential based on a reference potential; and
a potential comparing section that compares the comparison potential which has risen in accordance with the rise in the potential at the end point, with the reference potential, and outputs a result of the comparison, and
the first current generating section pulls the current from the end point, based on the result of the comparison output from the potential comparing section.

16. The communication device as set forth in claim 15, wherein the second current generating section adjusts the comparison potential to be equal to the reference potential by pulling a current from an output end of the comparison potential generating section based on the result of the comparison output from the potential comparing section, when the comparison result indicates that the comparison potential is higher than the reference potential.

* * * * *